United States Patent
Akhtar et al.

(10) Patent No.: US 7,817,635 B2
(45) Date of Patent: Oct. 19, 2010

(54) SIP HEADER REDUCTION

(75) Inventors: Haseeb Akhtar, Garland, TX (US);
David Brombal, Plano, TX (US);
Anthony Jones, Kanata (CA);
Mohamed Khalil, Murphy, TX (US)

(73) Assignee: Nortel Networks Limited, St. Laurent, Quebec (CA)

( * ) Notice: Subject to any disclaimer, the term of this patent is extended or adjusted under 35 U.S.C. 154(b) by 138 days.

(21) Appl. No.: 11/991,301

(22) PCT Filed: Sep. 1, 2006

(86) PCT No.: PCT/US2006/034416

§ 371 (c)(1),
(2), (4) Date: Feb. 29, 2008

(87) PCT Pub. No.: WO2007/028122

PCT Pub. Date: Mar. 8, 2007

(65) Prior Publication Data

US 2009/0129388 A1 May 21, 2009

Related U.S. Application Data

(60) Provisional application No. 60/713,958, filed on Sep. 2, 2005.

(51) Int. Cl.
*H04L 12/28* (2006.01)
*H04L 12/56* (2006.01)
*G06F 15/16* (2006.01)

(52) U.S. Cl. .................. 370/392; 370/389; 709/246; 709/247

(58) Field of Classification Search .......... 370/392, 370/389; 709/247, 246
See application file for complete search history.

(56) References Cited

U.S. PATENT DOCUMENTS

2003/0120813 A1* 6/2003 Majumdar et al. .......... 709/247
2003/0233478 A1* 12/2003 Chuah et al. ............... 709/247

OTHER PUBLICATIONS

Garcia-Martin, et. al., "The Session Initiation Protocol (SIP) and Session Description Protocol (SDP) Static Dictionary for Signaling Compressing (SigComp)", Feb. 2003.*

* cited by examiner

*Primary Examiner*—Ayaz R Sheikh
*Assistant Examiner*—Tarell Hampton
(74) *Attorney, Agent, or Firm*—D. Scott Hemingway; Hemingway & Hansen, LLP

(57) ABSTRACT

A SIP header reduction protocol operating on a communication network to compress the SIP header fields on SIP control messages used to initiate a SIP communication session. The new protocol is implemented on the mobile use equipment (UE) (301) and P-CSCF proxy SIP server (302). The prior SIGCOMP compression dictionary is used to compress those header field parameters defined by the SIGCOMP dictionary. A new 3G Dictionary is implemented with header field parameters for several wireless specific data elements and parameters necessary to access various wireless technologies and services which are missing from the SIP/SDP based SIGCOMP dictionary. Finally, an Encoding Assistant (EA) (310, 355) function is implemented on the UE and P-CSCF that operates a standard encoding and decoding of SIP message header fields to reduce those SIP header fields that are dynamic over time but are essentially static in terms of most user communication. The EA parameters can be updated periodically, while the 3G and SIGCOMP dictionary are static and not updated.

33 Claims, 4 Drawing Sheets

FIG. 2

105 INVITE
110 tel:+1-212-555-2222
115 SIP/2.0
120 Via:
125 SIP/2.0/UDP
130 [5555::aaa:bbb:ccc:ddd]:1357;
135 com=sigcomp;
140 branch=z9hG4bK
145 nashds7
150 Privacy:
155 none
160 From:
165 <sip:user1_public1@home1.net>;
170 tag=
175 171828
180 Security-Verify:ipsec-3gpp;q=0.1;alg=hmac-sha-1-96;spi-c=
185 78765432;
190 To:
195 <tel:+1-212-555-2222>

SIP HEADER REDUCTION

RELATED APPLICATION DATA

This application is related to U.S. Provisional Patent Application Ser. No. 60/713,958 filed on Sep. 2, 2005, and priority is claimed for this earlier filings under 35 U.S.C. §120. The Provisional Patent Applications are also incorporated by reference into this utility patent application.

TECHNICAL FIELD OF THE INVENTION

A message protocol reducing the size of the SIP header.

BACKGROUND OF THE INVENTION

The Internet, like so many other high tech developments, grew from research originally performed by the United States Department of Defense. In the 1960s, the military had accumulated a large collection of incompatible computer networks. Computers on these different networks could not communicate with other computers across their network boundaries.

In the 1960s, the Defense Department wanted to develop a communication system that would permit communication between these different computer networks. Recognizing that a single, centralized communication system would be vulnerable to attacks or sabotage, the Defense Department required that the communication system be decentralized with no critical services concentrated in vulnerable failure points. In order to achieve this goal, the Defense Department established a decentralized standard communication protocol for communication between their computer networks.

A few years later, the National Science Foundation (NSF) wanted to facilitate communication between incompatible network computers at various research institutions across the country. The NSF adopted the Defense Department's protocol for communication, and this combination of research computer networks would eventually evolve into the Internet.

Internet Protocols

The Defense Department's communication protocol governing data transmission between different networks was called the Internet Protocol (IP) standard. The IP standard has been widely adopted for the transmission of discrete information packets across network boundaries. In fact, the IP standard is the standard protocol governing communications between computers and networks on the Internet.

The IP standard identifies the types of services to be provided to users and specifies the mechanisms needed to support these services. The IP standard also specifies the upper and lower system interfaces, defines the services to be provided on these interfaces, and outlines the execution environment for services needed in the system.

A transmission protocol, called the Transmission Control Protocol (TCP), was developed to provide connection-oriented, end-to-end data transmission between packet-switched computer networks. The combination of TCP with IP (TCP/IP) forms a suite of protocols for information packet transmissions between computers on the Internet. The TCP/IP standard has also become a standard protocol for use in all packet switching networks that provide connectivity across network boundaries.

In a typical Internet-based communication scenario, data is transmitted from an originating communication device on a first network across a transmission medium to a destination communication device on a second network. After receipt at the second network, the packet is routed through the network to a destination communication device, and the TCP/IP protocol determines this routing. Because of the standard protocols in Internet communications, the IP protocol on the destination communication device decodes the transmitted information into the original information transmitted by the originating device.

TCP/IP Addressing and Routing

Under the TCP/IP protocols, a computer operating on an IP-based network is assigned a unique physical address called an IP address. The IP address can include: (1) a network ID and number identifying a network, (2) a sub-network ID number identifying a substructure on the network, and (3) a host ID number identifying a particular computer on the sub-network. A header data field in the information packet will include source and destination addresses. The IP addressing scheme imposes a consistent addressing scheme that reflects the internal organization of the network or sub-network.

A router is used to regulate the transmission of information packets into and out of the computer network. Routers interpret the logical address contained in information packet headers and direct the information packets to the intended destination. Information packets addressed between computers on the same network do not pass through a router on the boundary of the network, and as such, these information packets will not clutter the transmission lines outside the network. If data is addressed to a computer outside the network, the router on the network boundary forwards the data onto the greater network.

TCP/IP network protocols define how routers determine the transmission path through a network and across network boundaries. Routing decisions are based upon information in the IP header and corresponding entries in a routing table maintained on the router. A routing table contains the information for a router to determine whether to accept an information packet on behalf of a device or pass the information packet onto another router.

The IP-Based Mobility System

The Internet protocols were originally developed with an assumption that Internet users would be connected to a single, fixed network. With the advent of cellular wireless communication systems using mobile communication devices, the movement of Internet users within a network and across network boundaries has become common. Because of this highly mobile Internet usage, the implicit design assumption of the Internet protocols (e.g. a fixed user location) is violated by the mobility of the user.

In an IP-based mobile communication system, the mobile communication device (e.g. cellular phone, pager, computer, etc.) can be called a mobile node or mobile station. Typically, a mobile station maintains connectivity to its home network while operating on a visited network. The mobile station will always be associated with its home network for IP addressing purposes and will have information routed to it by routers located on the home and visited networks. The routers can be referred to by a number of names including Home Agent, Home Mobility Manager, Home Location Register, Foreign Agent, Serving Mobility Manager, Visited Location Register, and Visiting Serving Entity.

IP computer networks also include one or more network elements or components besides routers, such as hubs, switches, bridges, repeaters, gateways, and computer servers. Computer servers provide services to other computers and support the transfer and communication of data over the network. One common service is authentication, authorization, and accounting activity (AAA), and AAA servers on the home and foreign network perform the AAA activities for each network. Other common servers are Web servers, mail servers, and Local Area Network (LAN) servers.

Session Initiation Protocol (SIP)

The $3^{rd}$ Generation Partnership Project (3GPP) and $3^{rd}$ Generation Partnership Project 2 (3GPP2) are evolving third generation communication system standards for wireless communication systems transmitting multimedia services. These 3GPP and 3GPP2 mobile communication systems support multimedia telecommunication services delivering voice Internet Protocol (VoIP) and data, to include pictures, video communications, and other multimedia information over mobile wireless connections. These systems generally operate over a derivative Code Division Multiple Access (CDMA), General Packet Radio Service (GPRS) and/or Universal Mobile Telecommunication Systems (UMTS) communication system architecture.

The Session Initiation Protocol (SIP) was developed to setup communication paths over the system's routers and server computers for transmitting information packets containing multimedia communications over 3GPP2 systems. SIP is a signaling protocol used to initiate, manage, and terminate multimedia communications over packet networks. SIP has evolved to become the core protocol for establishing multimedia communication sessions over the Internet. It is a control protocol for creating, modifying, and terminating communication sessions with one or more participants. The protocol transmits information packets establishing, changing, and terminating communication sessions for multimedia applications in IP-based networks. SIP is used to determine user location, user availability, use capabilities, session setup, and session management. SIP registers IP-based address end points; performs address resolution, name mapping and call redirection functions; determines media capabilities of the target end points; registers end user preferences and call routing; registers and publishes presence information; establishes a communication session and support mid-session changes; and supports transfer and termination of calls. It is used for both voice and video communication in either point-to-point or multiparty sessions.

There are two basic types of SIP messages—Requests and Responses. Requests are sent from a client to a server, and Responses are sent from a server to a client. Requests message types include INVITE, Re-INVITE, ACK, BYE, CANCEL, OPTIONS, REGISTER, and INFO. INVITE messages are used to initiate a call. Re-INVITE messages are used in an ongoing communication to make a change in the media. ACK confirms a final response to an INVITE. BYE terminates a call. CANCEL terminates searches and ringing. OPTIONS requests the capabilities the other side. Response types include Provisional and Final responses. Examples of Response type messages include 100 Trying, 180 Ringing, 183 Progress, 200 OK, 401 Unauthorized, 403 Forbidden, 408 Request time-out, 600 Busy, and 603 Decline.

Each SIP message is composed of three parts 1) a Start Line, 2) a Header field, and 3) a Body. The Start Line designates the message type and the protocol version. Headers are used to convey message attributes and modify message meanings. The Body describes the message being initiated such as a multimedia session or a push-to-talk session. It may also be used to convey opaque textual or binary data that relates to the session.

The Session Initiation Protocol (SIP) handles initiation of interactive communications sessions between users and termination and modifications of sessions. "Initiating" requires determining where the user being contacted can be contacted at a particular moment. This might be on a PC at work, a mobile cell phone, a PC at home, or an IP desk phone at work or home.

Once the user being called is located, SIP performs its second main function of delivering a description of the invited session. SIP transports information about the protocol used to describe the session. Session Description Protocol (SDP) is used by SIP to describe the session. The SIP/SDP format can also be used to negotiate a common communication format for the session. After the session description has been delivered, SIP is used to transmit the response (accept, reject, etc.). If accepted, the session is now active. SIP can also be used to modify the session or terminate the session (i.e., hang up).

Session Description Protocol (SDP)

The SDP protocol describes multimedia session announcement, multimedia session invitation, and other forms of multimedia session initiation. SDP packets typically include session information (e.g. 1) name and purpose, 2) time session is active, and 3) contact information for user responsible for the session) and media information (e.g. type of media, transport protocol, media format, multicast address and Transport Port for media, and remote address for media and Transport Port for contact address).

SIP is based on an offer-answer paradigm. To initiate a session, the caller (known as the User Agent Client or UAC) sends a request (called an INVITE) to the person the caller wants to talk to. This message is sent through one or more call agent servers that route and deliver messages to the called party. The called party sends a response, accepting or rejecting the invitation, which is forwarded back through the same set of servers in reverse order.

For many applications, latency is an important issue. The determinative factor for how quickly a user can start to use the service is the session initiation latency, and excessive latency can become annoying to the frequent user. Transport latency is not as important to most users, but for some applications, transport latency can become problematic. For example, the latency associated with Push-to-Talk (PTT) initiation can be as much as 5 seconds.

A significant proportion of the initiation latency is due to message overhead because of the size of the SIP messages used for creating the SIP session. For example, the SIP INVITE message may be 1500 bytes or more in length, the SIP OK message is generally 200-700 bytes in length, and the SIP REGISTER message may be 350 bytes or more in length. If the size of these SIP messages could be significantly reduced, the initiation latency can be significantly reduced, improving service. Services that can benefit from a reduction in size of the SIP header include VoIP, Push-to-Talk (PTT), and Video Telephony (VT). Reducing the size of the SIP header should permit these services to operate on 1× Evolution-Data Optimized (1×EV-DO), Universal Mobile Telecommunications System (UMTS), Worldwide Interoperability for Microwave Access (WiMAX), and Wireless Local Area Network (WLAN). The reduction in SIP header size reduces call setup time significantly, obtaining VoIP post dial delay to less than 3 seconds, and PTT over Cellular (PoC) to a delay of less than one second. Sufficient size reduction will permit the SIP message to fit within the shorter bandwidth of the control channels. The control channels are used by wireless access technology to manage radio frequency resources, such as overhead messages, traffic channel acquisitions, manage hand-off, paging, and other aspects of radio frequency control.

One prior art method for reducing the SIP message size has been to establish a standardized dictionary as discussed in RFC 3485 "The Session Initiation Protocol (SIP) and Session Description Protocol (SDP) Static Dictionary for Signaling Compression (SIGCOMP)." In the SIGCOMP approach, a finite dictionary defines many SIP parameters as 3-byte data substitutions. However, there are problems with the SIG-COMP approach. SIGCOMP is limited by the terms defined in the dictionary, which is static. The SIGCOMP dictionary does not evolve as SIP or SDP evolved and has remained static and unchanged. Attempts have been made to use event based state tables to build a dynamic extension to the SIG-COMP library, but under this approach the initial REGISTER message lacks enough pre-history traffic data to take advantage of this feature and memory limitations in the user equipment (UE) (e.g. cell phone, personal data assistant, computer, etc) restricts storage of long term history in the state tables to build an adequate library. There is a need for a flexible protocol to reduce the message size of SIP messages and improve service on networks.

SUMMARY OF THE INVENTION

The invention is a new protocol for reducing the size of the SIP header fields. The Mobile Station, User Agent (UA), or User Equipment (UE), and the Proxy SIP Server, such as a Proxy Call Session Control Function (P-CSCF) implement the new protocol functions to reduce the size of the SIP header. In the UE, a SIP Client Application initiates the SIP communication request. An Encoding Assistant (EA) function operating on the UE performs the compression encoding/decoding on those compatible SIP headers to encode static information unique to the communication session. Next, the Static Dictionary for Signaling Compression (SIGCOMP) function processes the SIP header to substitute appropriate SIP header strings with the SIGCOMP dictionary or the 3G dictionary. The information packet is then transmitted by the over the air wireless connection to the P-CSCF for decoding. Only those data field elements that are truly dynamic to the communication are included in the SIP header, as the other elements are encoded and compressed according to the operative compression algorithm and dictionary or EA entry.

The P-CSCF function operates to encode/decode the information packet according to the 3G dictionary and SIGCOMP dictionary. The information packet is then transferred to the EA functionality for processing. After the appropriate decoding procedure, the information packet is processed by the applicable P-CSCF application. The reciprocal operations are performed by the various functional entities of the P-CSCF and UE as responses are generated and sent back to the UE.

It should further be noted and understood that as used herein "compression" does not necessarily convey that a data compression occurs as typically understood by those skilled in the art. The terms "reduction" and "compression" are used essentially interchangeably and refer primarily to reducing the header fields' size in a general sense. While a data compression may be performed as that term is understood in the typical sense when the terms "compression", "reduction", or "encoded" are used, those terms are not restricted to mean that such a classical data compression is in fact occurring.

BRIEF DESCRIPTION OF THE DRAWINGS

The objects and features of the invention will become more readily understood from the following detailed description and appended claims when read in conjunction with the accompanying drawings in which like numerals represent like elements and in which:

FIG. 2 shows a general overview of how the protocol operates to encode various constituents of a SIP message;

DETAILED DESCRIPTION OF THE PREFERRED EMBODIMENTS

Figure 1:
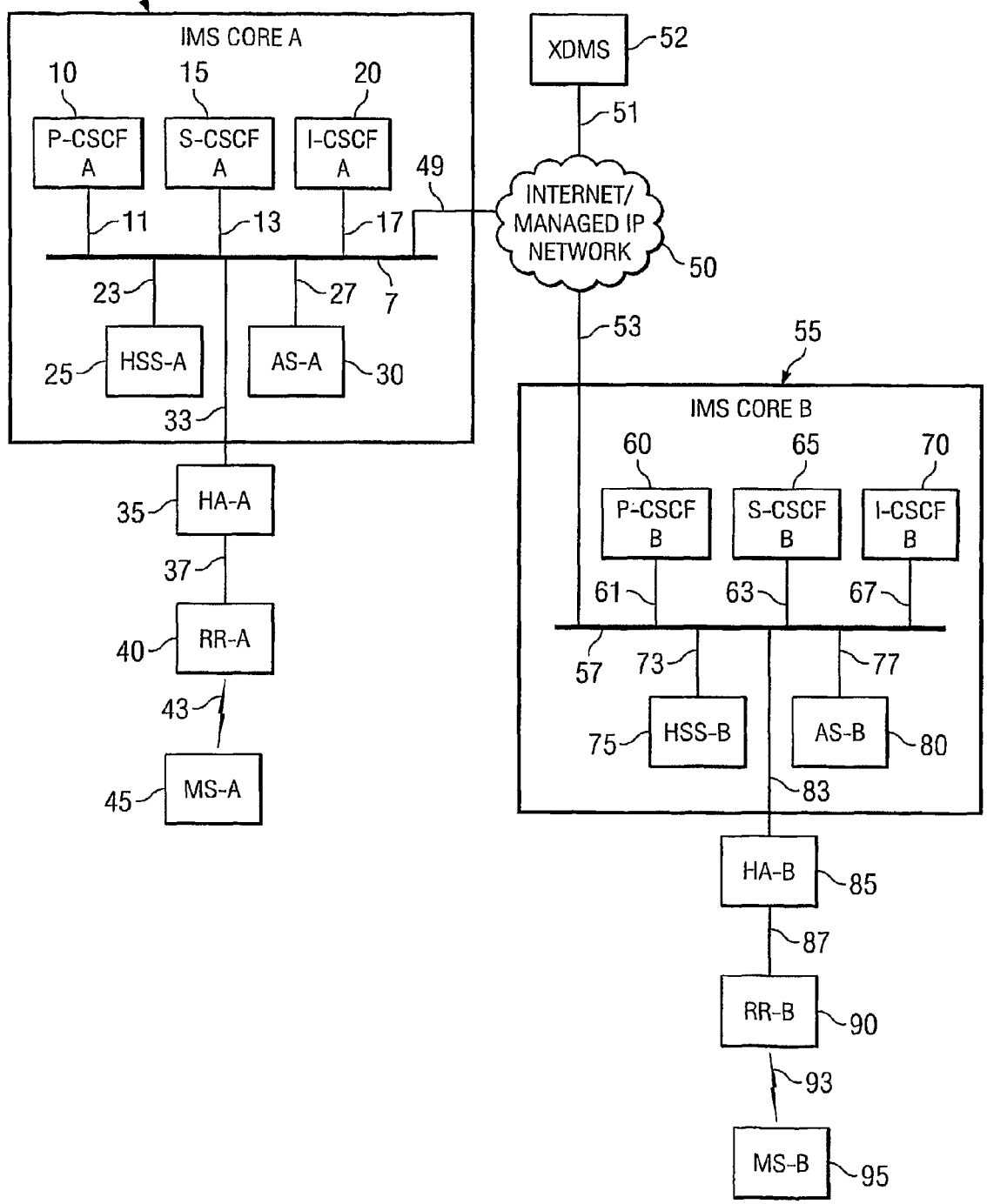
FIG. 1 is a diagram of a simple communication system using SIP for multimedia communication session initiation.

FIG. 1 shows a preferred embodiment of a communication system using the invention. FIG. 1 portrays the functional elements and entities in a pair of cellular communication networks in one embodiment of a 3GPP2 compliant network configuration. Two networks are shown linked by an Internet or managed IP network.

The first network A includes the Internet Protocol Multimedia Subsystem (IMS) core A 5. The IMS Core A 5 comprises five functional entities or elements. The Proxy Call Session Control Function (P-CSSF-A) 10 is the SIP proxy server for the linked mobile stations. The P-CSCF-A 10 forwards messages between the mobile stations and other SIP servers and handles the policy control function for Quality of Service (QoS) authorization. The P-CSCF-A 10 is linked to a central buss line by communication link 11. The Serving Call Session Control Function (S-CSCF-A) 15 is the SIP registrar, with cooperation from the Home Subscriber Server (HSS-A) 25. The S-CSCF-A 15 is the session control call state machine for the registered endpoint providing service triggers to the service platforms and controlling subscriber accessing services within the IP Multimedia application. The S-CSCF-A 15 has responsibility for interacting with network databases, such as the HSS-A 25 for mobility and AAA (Authentication, Authorization and Accounting) Servers for security. As part of the SIP Registration process a user is allocated the S-CSCF-A 15 to be responsible for all aspects of session control. The S-CSCF-A 15 is linked to the central buss line by communication link 13.

The Interrogating Call Session Control Function (I-CSCF-A) 20 acts as the entry point from other networks and allocates or determines the S-CSCF-A 15. The I-CSCF-A 20 can hide the network topology, and it is connected to the central buss line by communication link 17. The I-CSCF-A 20 handles registration, routing and forwarding of SIP messages and charging.

The Home Subscriber Server (HSS-A) 25 stores user profiles of the IMS and is queried to confirm that a user is permitted to register in the originating network. Stored parameter can include user identity, allocated S-CSCF name, roaming profile, authentication parameters, and service information. The HSS-A 25 is connected to the central buss line by communication link 23. The final component of the IMS Core A 5 is the Application Server (AS-A) 30 which executes service-specific logic such as call flows, database dips, and user interface interactions with subscribers. The AS-A 30 delivers services to the IMS through defined interfaces that can include push-to-talk, ringback tones, prepaid calling card, multimedia conferencing, and multimedia messaging service logic. It can also support running network games, video content, instant messaging, and presence services.

A communication link 33 connects the IMS Core A 5 to the Home Agent (HA-A) 35, which routes information packets to and from the mobile node. The HA-A 35 in turn is connected to the Radio Router (RR-A) 40 by communication link 37, which transmits information packets to the mobile station and receives information packets from the mobile station over wireless communication link 43. The Radio Router is a wireless network (e.g. a Radio Access Network (RAN) based on any access technology such as CDMA, UMTS, F-OFDM, OFDMA, etc) node that maintains the wireless connectivity with the mobile devices. The Radio Router node typically will include the mobile IP (both IPv4 and IPv6) Foreign Agent (FA) function. The Mobile Station (MS-A) 45, also referred to as User Equipment (UE), can be any mobile communication device capable of multi-media communication using the SIP protocol. The typical application will be a cellular phone, laptop computer, or similar device in a cellular network or other wireless network or wireless connection. However, this application can also be used on a wired communication network.

The second network B includes the Internet Protocol Multimedia Subsystem (IMS) core B 55. The IMS Core B 55 also comprises five functional entities or elements. The Proxy Call Session Control Function (P-CSCF-B) 60 is the SIP proxy server for the linked mobile stations. The P-CSCF-B 60 forwards messages between the mobile stations and other SIP servers and handles the policy control function for Quality of Service (QoS) authorization. The P-CSCF-B 60 is linked to a central buss line by communication link 61. The Serving Call Session Control Function (S-CSCF-B) 65 is the SIP registrar, with cooperation from the Home Subscriber Server (HSS-B) 75. The S-CSCF-B 65 is the session control call state machine for the registered endpoint providing service triggers to the service platforms and controlling subscriber accessing services within the IP Multimedia application. The S-CSCF-B 65 has responsibility for interacting with network databases, such as the HSS-B 75 for mobility and AAA (Authentication, Authorization and Accounting) Servers for security. As part of the SIP Registration process a user is allocated the S-CSCF-B 65 to be responsible for all aspects of session control. The S-CSCF-B 65 is linked to the central buss line by communication link 63. The Interrogating Call Session Control Function (I-CSCF-B) 70 acts as the entry point from other networks and allocates or determines the S-CSCF-B 65. The I-CSCF-B 70 can hide the network topology, and it is connected to the central buss line by communication link 67. The I-CSCF-B 70 handles registration, routing and forwarding of SIP messages and charging.

The Home Subscriber Server (HSS-B) 75 stores user profiles of the IMS and is queried to confirm that a user is permitted to register in the originating network. Stored parameter can include user identity, allocated S-CSCF name, roaming profile, authentication parameters, and service information. The HSS-B 75 is connected to the central buss line by communication link 73. The final component of the IMS Core B 55 is the Application Server (AS-B) 80 which executes service-specific logic such as call flows, database dips, and user interface interactions with subscribers. The AS-B 80 delivers services to the IMS through defined interfaces that can include push-to-talk, ringback tones, prepaid calling card, multimedia conferencing, and multimedia messaging service logic. It can also support running network games, video content, instant messaging, and presence services.

A communication link 83 connects the IMS Core B 55 to the Home Agent (HA-B) 85, which routes information packets to and from the mobile station. The HA-B 35 in turn is connected to the Radio Router (RR-B) 40 by communication link 37, which transmits information packets to the mobile station and receives information packets from the mobile station over wireless communication link 93. The Radio Router is a wireless network (e.g. a Radio Access Network (RAN) based on any access technology such as CDMA, UMTS, F-OFDM, OFDMA, etc) node that maintains the wireless connectivity with the mobile devices. The Radio Router node typically will include the mobile IP (both IPv4 and IPv6) Foreign Agent (FA) function. The Mobile Station (MS-B) 95, also referred to as User Equipment (UE), can be any mobile communication device capable of multi-media communication using the SIP protocol. The typical application will be a cellular phone, laptop computer, or similar device in a cellular network or other wireless network or wireless connection. However, this application can also be used on a wired communication network.

Both the networks are connected to the Internet (and/or a managed IP based network) and a Shared XML Document Management Server (XDMS). The shared XDMS is responsible for storing and managing the shared lists and the group lists in the network The buss line 7 in IMS Core A 5 is connected to the Internet 50 (or alternatively a managed IP based network) by communication link 49, and the buss line 67 in IMS Core B 55 is connected to the Internet 50 (or alternatively a managed IP based network) by communication link 53. The XDMS 52 is connected to the Internet 50 (or alternatively a managed IP based network) by communication link 51. The XDMS may store users' group profile information for the two networks, and the server can be integrated into the IMS cores as two separate servers storing only users belonging to that local network.

The central goal of the invention is reduction of the SIP header to reduce latency and other problems degrading service in a multi-media environment. Any SIP message-type can be compressed using the invention, which expands upon the SIGCOMP approach to provide, a more flexible, comprehensive mechanism for reducing header size and reducing message overhead. The approach herein is to transmit only the dynamic information over the wireless link. A Client-Server encoding relationship is established that stores static data in the network, typically in the P-CSCF, during SIP registration. An encoding assistant (EA) is introduced at the User Equipment (UE) and the P-CSCF, which implements a standard encoding and decoding of SIP messages at the UE and P-CSCF to obtain a reduced size SIP message. Finally, there is an additional library definition designated as 3G Dictionary that is used which adds additional defined elements.

FIG. 2 shows a general overview of how the protocol operates to encode various constituents of a SIP message. The SIGCOMP dictionary includes those constituent elements 105, 115, 120, 125, 135, 140, 150, 155, 160, 170, and 190. Using SIGCOMP, compression and decompression occurs at the endpoints. The library is static and used in conjunction with several compression/decompression protocols to compress and decompress the text-based SIP and SDP fields. The SIGCOMP dictionary includes alphanumeric strings that appear in SIP and SDP messages. While the dictionary does not cover all the strings, it does include many of the strings appearing in SIP and SDP signaling messages. The SIGCOMP library encodes contents of each parameter and is used for encoding the reduced SIP parameter space. The other constituent elements are not defined in the SIGCOMP dictionary and are therefore retained in their entirety under the present protocol. However, elements 150, 155, and 160 can be inserted/retrieved by the Encoding Assistant (EA) function.

Under the invention, the constituent element 180 is included in a new static library 3G dictionary. The SIGCOMP dictionary lacks several wireless specific data elements and parameters necessary to access various wireless technologies and services. The 3G dictionary introduces new mobility elements not found in SIGCOMP to function in the wireless environments found in IMS and other 3GGP/3GPP2 systems. The 3G dictionary serves to enhance the exiting SIGCOMP dictionary and is used essentially identically.

The constituent elements 110, 130, 165, and 195 are compressed/decompressed by a new Encoding Assistant (EA) function operating at the UE (e.g. Mobile Station) and P-CSCF. The EA will encode and decode SIP header fields that are dynamic over time but are essentially static in terms of most user communication. For example, the elements 110, 130, and 195 can be encoded/decoded (e.g. inserted/retrieved) by the EA function at the UE and P-CSCF, which can be updated and modified from time to time. The element 110 can be encoded/decoded by a buddy list/contact list stored on a computer server. Finally, the elements 145, 165, 175 and 185 are dynamic information sent over the air from the UE to the RR and are not compressed/decompressed.

In this new header reduction protocol, the SIP registration procedure is modified. To establish context, the UE, XDMS, and P-CSCF, I-P-CSCF, and S-CSCF exchange indexed lists of identity components. These include the IP addresses, contact lists, and Uniform Resource Identifiers (URIs). These components are used in the SIP header fields, including Via, From, Contact, P-Preferred-Identity, and the like. This can also include an exchange of an indexed list of access networks supported, which can be used in the P-Access-Network-Info SIP info, and an exchange of indexed list of security protocols supported, which can be used in the Security-Verify SIP header field. The modified registration also need to identify the supported functions of SIP Header Reduction algorithm and 3G dictionary, and in general also requires new or modified SIP header fields. This context establishment process during SIP Registration described herein may also be performed by existing SIGCOMP protocol such as by establishing a User Specific Dictionary (USD) at the UE and at the P-CSCF as specified in RFC 3321 "Signaling Compression (SigComp)-Extended Operations."

Figure 3:
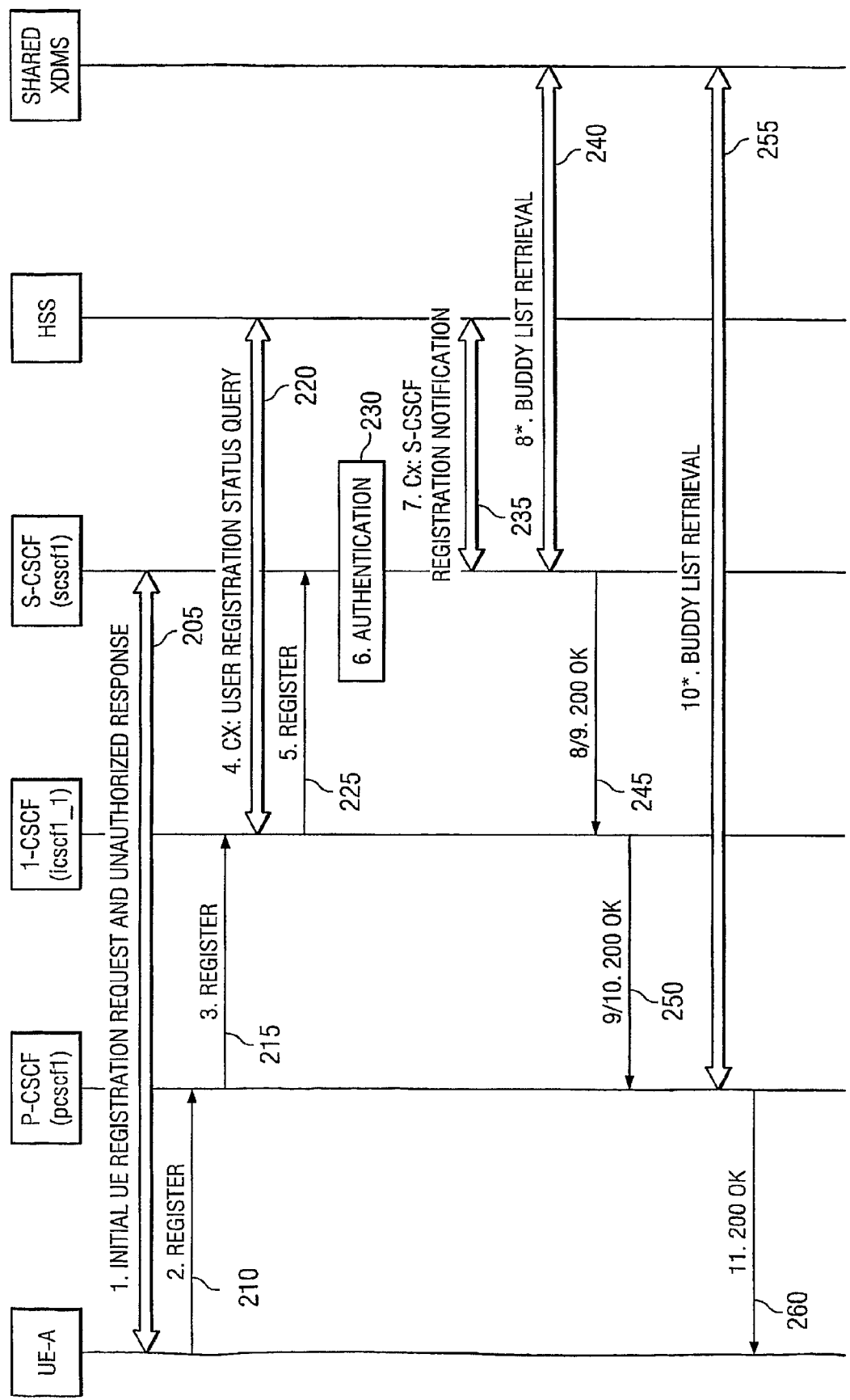
FIG. 3 is a message flow chart showing modifications for SIP registration to implement the new protocol.

FIG. 3 shows an embodiment for the modified registration protocol of the invention. In this embodiment, the UE registers on a network requiring an exchange of SIP request and response messages among the UE, the P-CSCF, I-CSCF, S-CSCF, HSS and the Shared XDMS to set up the communication. In step 205, the procedure for initial UE registration request and response are performed to register the UE with the network to authorize network resources for the SIP communication session. During this procedure, various messages are exchanged between the UE, P-CSCF, I-CSCF, and S-CSCF that include the 401 Unauthorized Response challenge sent to the UE used to authenticate the UE and authorize access to the network with a Response calculated by the UE. The details of this message sequence are specified in various 3GPP and 3GPP2 standard documents. In step 210, the UE sends a Register message to the P-CSCF to establish context, check supported functions, and execute EA functions. This Register message will also include the calculated response to the 401 Unauthorized Response message. In response, the EA function in the P-CSCF will operate to encode or decode appropriate SIP header fields and maintain SIP header reduction state per the SIP registration session. Establishing context requires the exchange of indexed list of Identity components which includes the IP addresses, URIs, and contact list to be used in SIP header fields that include 'Via', 'From', 'Contact', and 'P-Preferred-Identity'. The exchange of indexed list of access networks supported is also performed, which are used in the "P-Access-Network-Info" SIP header field. The exchange of indexed list of security protocols is also supported, which are used in the "Security-Verify" SIP header field. In step 215, the P-CSCF transmits a Register message to the I-CSCF.

In step 220, a user registration status query procedure is performed over the Cx interface between the I-CSCF/S-CSCF and the HSS. During the procedure, the I-CSCF requests information associated with subscriber registration by sending the private user identity, public user identity, and visited domain name to the HSS. The HSS in turn transmits the S-CSCF name established during the initial UE registration procedure. In step 235, the Register request is transmitted from the I-CSCF to the S-CSCF. The Authentication procedure is accomplished at step 225 where the S-CSCF checks integrity of the Register request, which carries the authentication response. A successful check authenticates the UE identity is registered in the S-CSCF. In step 235, an S-CSCF registration notification procedure is done on the Cx interface where the S-CSCF indicates to the HSS that the UE has been registered for the session. The HSS response can include user profile data received at the S-CSCF.

In step 240, an optional procedure can be performed to retrieve contact list data from the shared XDMS. In this step, collective contact information for other users stored as a specific "buddy list" or contact list is retrieved for use in the communication session. Typically, this information is used to setup a communication session with one or more users associated with a single indexed contact list corresponding to the specified parameter. In step 245, the S-CSCF transmits a 200 OK response message to the I-CSCF signifying successful registration. In step 250, the I-CSCF forwards the 200 OK response to the P-CSCF. In step 255, the P-CSCF can optionally retrieve contact list data from the shared XDMS. The P-CSCF also operates to create indexed list of SIP encoded header data, and executes other EA functions. Finally, in step 260, the P-CSCF transmits the 200 OK response to the UE.

Option tags can be specified for supported SIP header fields. The "encode" option tag indicates if the SIP Header Reduction protocol described herein is supported. The "3G-Dictionary" option tag indicates the presence/absence of 3G Dictionary support. In order for the entire protocol to operate on the packet, both option tags must be present if incorporated.

Additionally, new SIP header fields have been added and include the following:
1. P-Encode-Identities: Index of public IDs (IP addresses, URIs, E.164 etc.)
2. P-Encode-Access-Networks: Index of supported access networks such as CDMA, 802.11 etc.
3. P-Encode-Security: Index of security protocols supported such as IPSec, TLS etc.
4. P-Contact-List: Index of contact List
5. P-Contact-List-Location: Location of the database (such as shared XDM) for storing the contact list These fields allow the client and the server to send compressed information for the respective field and are utilized by the EA function on the UE and P-CSCF.

Six SIP/SDP header fields use various forms of identity information to describe the user. These fields include the "Via" identity, From identity; and Contact identity fields, and can also include the new "P-Preferred-Identity" SIP header field, the SDP "o=" line, and the SDP "c=" line. The SDP "o=" and "c=" lines will generally be created by information available at the P-CSCF, so no additional values need to be exchanged for these two SDP fields. The "P-EncodeIdentities" SIP header field permits entries to accommodate the "Via", "From", and "Contact" header parameters. The UE and P-CSCF establish an indexed list of these values and exchanges the indexed list when identifying one of the entries. The transfer can be accomplished using the new "P-Encode-Identities" header attached to the 200 OK SIP response message (or similar SIP message). A four-bit index list of identity information exchanged between the UE and the P-CSCF, for example, may contain up to sixteen such entries.

Only a limited set of access networks types will connect to the UE. A set of values in defined and provisioned on the P-CSCF to identify the initial set of network types. The list of network types can be exchanged between the UE and the P-CSCF using the P-Encode-Access header attached to the 200 OK (or similar) SIP response message. A three-bit index list of network types exchanged between the UE and P-CSCF, for example, may contain up to eight such entries.

Only a limited set of security types are expected to be utilized by the connection to the UE. A set of values in defined and provisioned on the UE and/or the P-CSCF to identify the initial set of security types. The list of security types can be exchanged between the UE and the P-CSCF using the P-Encode-Security header attached to the 200 OK (or similar) SIP response message. A four-bit index list of security types exchanged between the UE and the P-CSCF, for example, may contain up to sixteen such entries.

Addresses used to route the initial SIP INVITE or other request message (e.g. REGISTER) are found in a Contact List. The contact list contains the information necessary to establish a communication and generally will include a name element along with the communication routing (e.g. telephone number, IP address, etc). It is envisioned that contact list information will be store on the shared XDMS or related memory location and transferred to the P-CSCF during SIP registration using the "P-Contact-List" header. The list will be transferred to the P-CSCF (and/or to the I-CSCF, S-CSCF, etc.) using the SIP 200 OK or other response message to the REGISTER request. A ten-bit index list for storing the contact list can store up to 1024 contact list entries.

The contact list of a user is located in a database on the home network (e.g. service provider's network). Typically, this will be a shared XDMS, but the list can be stored at another location. The P-CSCF may not have an association for the location of the database, so the P-Contact-List-Location header in a SIP message will include the address of the database storing the contact list of the specified user.

The 3G Dictionary also adds new parameters that may be found in the SIP header fields or the SDP parameters. The new parameters for the 3G Dictionary that may be included in the SIP header fields include the following:
1. Max-Forwards: 70
2. P-Preferred-Identity
3. P-Access-Network-Info
4. Require: sec-agree, precondition
5. Supported: 100 rel
6. Spi:s
7. Port:c=
8. Port:s=

Figure 4:
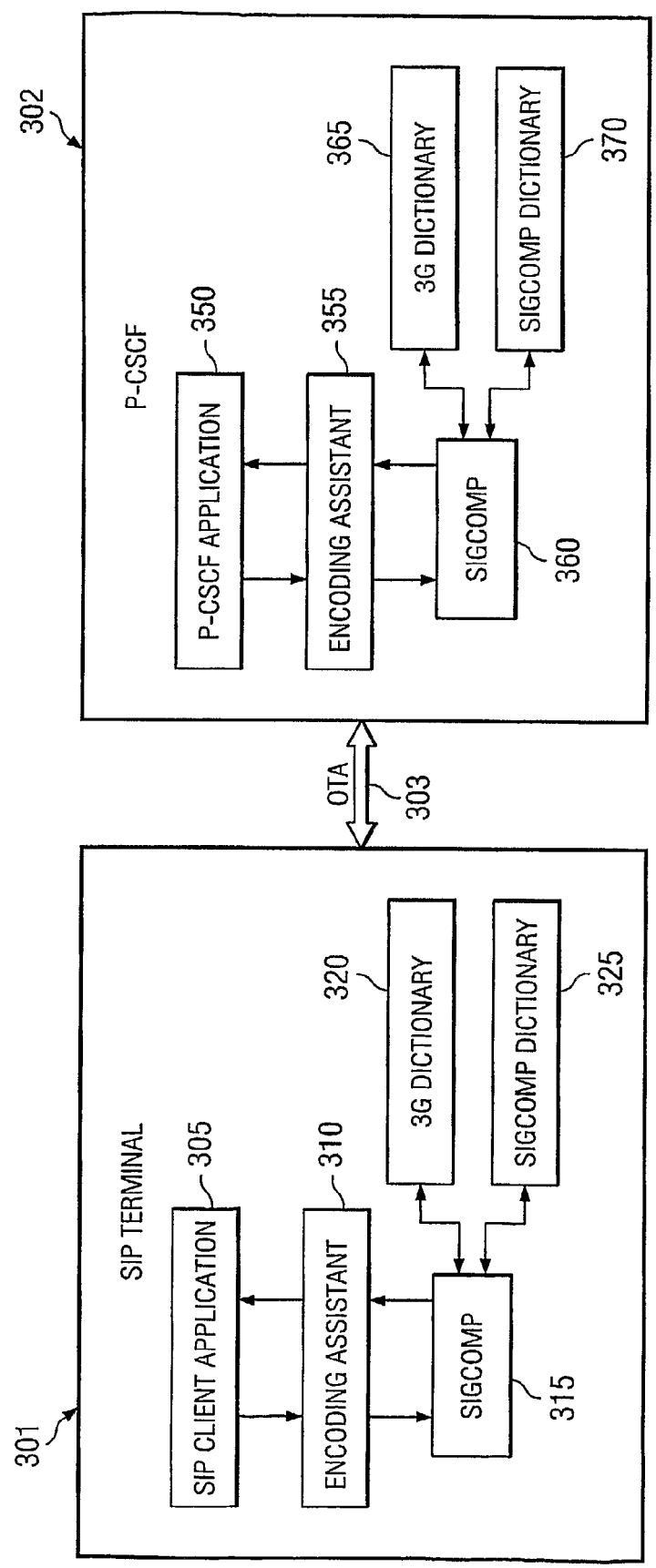
FIG. 4 shows a hierarchical stack summarizing how the protocol functions.

The new parameters for the 3G Dictionary that may be part of the SDP include the following:
1. Content-Type: application/SDP
2. a=des:qos mandatory, local sendrecv
3. a=des:qos none, local sendrecv
4. a=inactive These data elements are included in the 3G dictionary and add wireless specific data elements missing from the SIP/SDP SIGCOMP dictionary. These data elements are found in both the SIP request SIP message (e.g. INVITE, REGISTER, etc) and the SIP response (e.g. 200 OK, 180 Ringing, etc.) messages used to initiate a session. These parameters constitute the input strings used in the compression algorithm to generate the reduced/compressed output parameter strings. FIG. 4 shows a hierarchical stack summarizing how the protocol functions. In the UE protocol execution 301, the SIP Client Application 305 initiates the SIP communication request message generation and transmitting. Control and messaging information packets pass through the Encoding Assistant function 310 that performs the compression encoding/decoding on those compatible SIP headers. The Encoding Assistant 310 then transfers processing of the information packets to the SIGCOMP function 315 which processes the SIP header to substitute appropriate SIP header string parameters with the 3G dictionary 320 and/or the SIGCOMP dictionary 325 (as specified by RFC 3485). The information packet is then transmitted by the over the air wireless connection 303 to the P-CSCF. Only those data field elements that are truly dynamic and unique to the communication are included unchanged (e.g. non-compressed) in the SIP header, as the other elements are encoded and compressed according to the operative compression algorithm and dictionaries and/or EA function. The P-CSCF function 302 to encode/decode the information packet according to the 3G dictionary and SIP/SDP SIGCOMP dictionary. The information packet is transferred to the EA function for processing, and then the information packet is processed by the applicable P-CSCF application. The reciprocal operations are performed by the various functional entities of the P-CSCF 302 and UE 301 as responses are generated and sent back to the UE. The EA function described herein may also be implemented using the existing compression technologies such as SIGCOMP protocol as specified in RFC 3320 "Signaling Compression (SigComp)", RFC 3321 "Signalling Compression (SigComp)—Extended Operations", RFC 3485 "The Session Initiation Protocol (SIP) and Session Description Protocol (SDP) Static Dictionary for Signaling Compression (SigComp)", and RFC 3486 "Compressing the Session Initiation Protocol (SIP)".

Table 1 is a summary of the SIP header fields and the compression method used. For example, the "INVITE" parameter of the first header field is handled by the SIGCOMP and will occupy 24 bits. Looking a the "P-Preferred-Identity: "John Doe" sip:user1_public1@home1.net>" header field, the 3G dictionary handles the encoding/decoding for the "P-Preferred-Identity" portion and the EA function handles it for the "John Doe" sip: user1_public1@home1.net>" portion.

The EA function required to support the SIP header reduction protocol is divided into two components—an encoding component and a decoding component. The EA operates on the SIP header parameters to perform encoding and decoding functions. It operates essentially identically on the UE and on the P-CSCF. Referring in part to Table 1, the EA encodes the callee's Uniform Resource Identifier (SRI) or E.164 address in the SIP Request line based on the 10-bit index associated with a specific Contact List entry. The EA deletes the protocol description component (i.e. 'SIP/2.0/UDP') if present in any SIP message. The EA encodes the identity component (IP address, URI, etc.) of the "Via", "From", and "Contact" following header fields based on the four-bit index values exchanged during the SIP Registration. The EA deletes the "comp=sigcomp" and "branch=z9hG4bK" components of the "Via" header. If the "comp=sigcomp" is not present, the EA leaves the "branch" component in place.

The EA changes the components of the "Contact" header by encoding the identity component (IP address, URI, E.164 address, etc.) based on the four-bit index values exchanged during the SIP Registration. The EA indicates the presence of the "comp=sigcomp" component by adding one bit as follows.

0="comp=sigcomp" present
1="comp=sigcomp" absent

The EA will delete the "tag=" component of the "From" header (leaving the tag's value), delete the "To" header from all SIP Invite messages (if the callee's URI can be encoded as 10-bit index from the Contact List), and encode the "P-Preferred-Identity" header using the respective index value established during the SIP Registration. The EA will encode the access network type in any "P-Access-Network-Info" header based on the index value exchanged during the SIP Registration.

The EA will change components of any "Security-Verify" header as specified. The EA will delete the text before the "alg" component (such as "ipsec-3gpp" and "q=0.1"), replace the "alg" component with the specified four-bit index number of the security algorithm as established during the SIP Registration and convert the values of "spi-c" and "spi-s" components into 32-bit integer numbers. The EA will also delete the "Allow" header if the SIP Header Reduction algorithm described herein is supported between the UE and the P-CSCF. The "Allow" header will only be deleted in the uplink direction (from the UE to the P-CSCF).

The EA will delete the "Privacy" header if the SIP Header Reduction algorithm described here is supported between the UE and the P-CSCF. The SIP message name, such as such as INVITE, will also be deleted from the "CSeq" header if the value is the same as the message's Request type. The EA will also delete following SDP parameters if present in any SIP message in the uplink direction (from the UE to P-CSCF):

1) the "o=" line,
2) the "s=" line,
3) the "c=" line (if "c=" line is at the session level), and
4) the "t=" line SDP parameters The EA also will delete the "b=" line if present in any SIP message in the uplink direction, delete the "a=curr: local none" line if the "precondition" value is included in the "Require" header in the uplink direction (from the UE to the P-CSCF), and delete the "a=curr: remote none" line if the "precondition" value is included in the "Require" header in the uplink direction (from the UE to the P-CSCF). The EA will also delete the "a=fmtp" line if present in any SIP message in the uplink direction, and delete the "a=rtpmap: nn telephone event" (where "nn" is any two-digit number) line if it is present in any SIP message in the uplink direction (from the UE to the P-CSCF).

The EA also performs decoding functions within both the UE and the P-CSCF. The EA decodes the callee's URI (or E.164 address) based on the 10-bit index associated with that specific Contact list entry, and decodes the identity component (IP address, URI, E.164 address, etc.) of the "Via", "From", and "Contact" header fields based on the four-bit index values exchanged during the SIP Registration. The EA adds the "tag=" component to the "From" header field to any SIP message if it is not included. The "tag=" component is added before the value of "tag". The EA decodes any "P-Preferred-Identity" header with the respective index value negotiated during the SIP Registration.

The EA changes the components of the "Contact" header by decoding the identity component (IP address, URI, E.164 address, etc.) based on the four-bit index values exchanged during the SIP Registration. The EA adds the "comp=sigcomp" component by evaluating the last bit of the "Contact" header as follows.

0=Add "comp=sigcomp"
1=Do not add "comp=sigcomp"

The EA will decode the access network type in any "P-Access-Network-Info" header based on the index value exchanged during the SIP Registration. The EA will also add the "To" header in any SIP messages if it is not included and if the callee's URI is encoded as a 10-bit index in that particular SIP message.

The EA will change components of the "Security-Verify" header field as specified. First, the EA will add the text before the "alg" component based on the configuration parameter at the UE and/or at the P-CSCF indicating the security protocol to be used for this specific SIP session. Second, the EA will decode the "alg" component's four-bit index number with the appropriate security algorithm using a lookup table created during the SIP Registration. Finally, the EA will convert 32-bit integer values of the "spi-c" and "spi-s" components into ASCII characters.

If absent, the EA will add the SIP message name (such as INVITE) to the "CSeq" header after the "CSeq" number based on the first line of that particular SIP message. The EA shall create several SDP parameters if they are missing from a SIP message and if the same SIP message has the "application/sdp" value present in a "Content-Type" header. The EA will create the "o=" line based on the following guidelines:

1) Use "-" value for the <<username>> component of the "o=" line.
2) Choose unique values (across time) for the <<session id>> and <version>> components of the "o=" line.
3) The choice of IP4 or IP6 shall be based on address format discerned in the "Via" header. If a Fully Qualified Domain Name (FQDN) is used instead of IP format, the EA will examine the IP layer header for the version of the IP address.

The EA will create the "s=" line and the "s=" line (at the session level). The EA will also create the "c=" line (at the session level) The choice of IP4 or IP6 will be based on address format of the "Via" header. If a FQDN is used instead of IP format, the EA will determine the version of the IP address by examining the IP layer header. The EA will create the "t=" line as "t=0 0". The EA will create the "b=" line based on the configuration parameters (configured at the UE and/or the P-CSCF) associated with the media type (such as audio, video, etc.) indicated in the "m=" line. The EA will create the "a=curr: local none" line and "a=curr: remote none" line if they are missing from the SIP message and if the same message has the "precondition" value present in the "Require" header.

The EA will create the "a=fmtp: nn <<format specific parameters>>" line based on the configuration parameter (configured at the UE and/or P-CSCF) associated with codec type specified in the "m==" and "a=rtpmap" lines. The value of "nn" will equal the first two digits of the codec code component of the "m=" line. The EA will create the "a=rtpmap: nn telephone event" (where "nn" is any two-digit number) line if it is missing in any SIP message and if the same SIP message includes the "m=" line. The value of "nn" shall be the last two digits of the codec code component of the "m=" line. The EA will add the "comp=sigcomp" and "branch=z9hG4bK" components of the "Via" header field to any SIP message if the "branch=z9hG4bK" component is missing.

Several decoding requirements are applicable only for the EA operating on the P-CSCF server component. The EA shall add the "Route" header field to all SIP messages if it is not included by the UE. The content of the "Route" header will be same as the content of the "Service-Route" header field saved by P-CSCF earlier (during the SIP Registration time). The EA will add the "Allow" header field to all SIP messages in the uplink direction (from UE to P-CSCF) if it is not included by the UE. The content of the "Allow" header field will be the same as the content of the "Allow" header saved by P-CSCF earlier (during the SIP Registration). The EA will add the "Privacy" header field to all SIP messages if it is not included by the UE. The content of the "Privacy" header field will be the same as the content of the "Privacy" header field saved by the P-CSCF server earlier (during the SIP Registration).

Table 2 graphically depicts the header field reduction benefits from the SIP Reduction protocol described herein (by using an Example SIP Invite message that is 1121 bytes before compression. In this example, the reduction achieved by using the static SIP/SDP based on the SIGCOMP dictionary is from 87 bytes to 39 bytes. The reduction achieved by using the static 3G Dictionary reduction is from 189 bytes to 30 bytes. Finally, the reduction achieved by using the Encoding Assistant (EA) is from 752 bytes to 16 bytes. Total reduction of the SIP header fields reduces the size of the original (non-compressed) SIP header fields from 1121 bytes to 177 bytes. This represents a reduction in size of 85%, and it is contemplated that a reduction to the header size of at least 75% can be accomplished using this protocol.

While the invention has been particularly shown and described with respect to preferred embodiments, it will be readily understood that minor changes in the details of the invention may be made without departing from the spirit of the invention. Having described the invention, we claim:

TABLE 1

| Header Field | Field Parameter/Header Function | SIGCOMP Dictionary | Nortel Dictionary | Encoding Assistant | Encoding Assistant Function | Bits |
|---|---|---|---|---|---|---|
| INVITE tel:+1-212-555-2222 SIP/2.0 | INVITE | Yes | No | N/A | N/A | 24 |
| | URL or E.164 (of the called party) | No | No | Yes | Use a 10-bit buddy lists (1024 users). Stored during registration. | 10 |
| | SIP/2.0 | Yes | No | N/A | N/A | 24 |
| Via: SIP/2.0/UDP (5555::aaa:bbb:ccc:ddd):1357; comp=sigcomp,branch=z9hG4bKn ashds7 | Via: | Yes | No | N/A | N/A | 24 |
| | SIP/2.0/UDP | Yes | No | Yes | Added by EA. | 0 |
| | IP Address (of the calling party) | No | No | Yes | Four-bit index of public ID and port. | 4 |
| | comp=sigcomp | Yes | No | Yes | Added by EA. | 0 |
| | branch=z9hG4bk | Yes | No | Yes | Added by EA. | 0 |
| | Next 7 characters of branch (e.g., nashds7) | No | No | N/A | N/A | 72 |
| Max-Forwards: 70 | Max-Forwards: 70 | Partial | Yes | N/A | N/A | 24 |
| Route: <sip:pcscf1.visited1.net:7531;lr; comp=sigcomp>, <sip:scscf1.home1.net;lr> | P-CSCF address and the Service Route Header | Partial | No | Yes | Added before forwarding onward. Stored at registration. | 0 |
| P-Preferred-Identity: "John Doe" <sip:user1_public1@home1.net> | P-Preferred-Identity: | No | Yes | N/A | N/A | 24 |
| | "John Doe" <sip:user1_public1@home1.net> | No | No | Yes | Four-bit index of public ID and port. | 4 |
| P-Access-Network-Info: 3GPP-UTRAN-TDD, utran-cell-id-3gpp=234151DOFCE11 | P-Access-Network-Info: | No | Yes | N/A | N/A | 24 |
| | 3GPP-UTRAN-TDD; utran-cell-id-3gpp= | Partial | No | Yes | Three-bit index of access networks | 3 |
| | 15 character Cell ID | No | No | N/A | N/A | 120 |
| Privacy: none | Privacy requirement of the calling party | Partial | No | Yes | Stored during registration. | 0 |
| From: <sip:user1_public1@home1.net>; tag=171828 | From: | Yes | No | N/A | N/A | 24 |
| | URI (of the calling party) | No | No | Yes | Four-bit index of public ID and port. | 4 |
| | tag= | Yes | No | Yes | Added by EA. | 0 |
| | A six digit value of tag (e.g. 171828) | No | No | N/A | N/A | 48 |
| To: <tel:+1-212-555-2222> | To: | Yes | No | Yes | Added by EA. | 0 |
| | URI or E.164 (of the called party) | No | No | Yes | Added by EA from the buddy list. | 0 |
| Call-ID: cb03a0s09a2sdfglkj490333 | Call-ID: | Yes | No | N/A | N/A | 24 |
| | 30 character Call ID value (e.g. cb03a0s09a2sdfglkj490333) | No | No | N/A | N/A | 240 |
| Cseq: 127 INVITE | Cseq: | Yes | No | N/A | N/A | 24 |
| | Five digit Cseq number (e.g. 127) | No | No | N/A | N/A | 40 |
| | INVITE | Yes | No | Yes | Added by EA. | 0 |
| Require: precondition, sec-agree | Precondition for QoS resource reservation | Partial | Yes | N/A | N/A | 24 |
| Supported. 100rel | Supported: 100rel | Partial | Yes | N/A | N/A | 24 |
| Security-Verify: ipsec-3gpp; q=0.1;alg=hmac-sha-1-96; spi-c=98765432; spi-s=87654321; port-c=8642; port-s=7531 | Security-Verify. ipsec-3gpp;q=0.1; alg=hmac-sha-1-96; spi-c= | Partial | No | Yes | Four-bit index of security algorithms. | 4 |
| | 32-bit value of spi-c (e.g. 98765432) | No | No | Yes | Convert 32-bit SPI into ascii format. | 32 |
| | spi-s: | No | Yes | N/A | N/A | 24 |

TABLE 1-continued

| Header Field | Field Parameter/Header Function | SIG-COMP Dictionary | Nortel Dictionary | Encoding Assistant | Encoding Assistant Function | Bits |
|---|---|---|---|---|---|---|
| | 32-bit value of spi-s (e.g. 87654321) | No | No | Yes | Convert 32-bit SPI into ascii format. | 32 |
| | port-c= | No | Yes | N/A | N/A | 24 |
| | Four digit value of port-c (e.g. 8642) | No | No | N/A | N/A | 32 |
| | port-s= | No | Yes | N/A | N/A | 24 |
| | Four digit value of port-s (e.g. 7531) | No | No | N/A | N/A | 32 |
| Contact: | Contact: | Yes | No | N/A | N/A | 24 |
| <sip:[5555..aaa:bbb:ccc:ddd]:1357; comp=sigcomp> | Calling party's IP address and port number with SIGCOMP option | No | No | Yes | Four-bit index of public ID and port. | 4 |
| Allow: INVITE, ACK, CANCEL, BYE, PRACK, UPDATE, REFER, MESSAGE | Set of methods supported by the calling party | No | No | Yes | Stored during registration and added by EA. | 0 |
| Content-Type: application/sdp | Media type of the message body sent to the called party | Partial | Yes | N/A | N/A | 24 |
| Content-Length: (_) | Content-Length: | Yes | No | N/A | N/A | 24 |
| | Three digit value for Content-Length (1-999) | No | No | N/A | N/A | 24 |
| v=0 | v=0 | Yes | No | N/A | N/A | 24 |
| o=2987933615 2987933615 IN IP6 5555:aaa:bbb:ccc:ddd | o=<username><session id><version><network type><address type> | Partial | No | Yes | Added by EA. Username, algorithm for generating session ID, version, network type and address type stored during registration. | 0 |
| s=- | Session name | Partial | No | Yes | Added by EA. | 0 |
| c=-IN IP6 5555::aaa:bbb.ccc:ddd | C=IN IPv6 | Partial | No | Yes | Same protocol as in the SIP header. Added by EA. | 0 |
| | IP Address of the calling party's media (index of the public ID) | Partial | No | Yes | Four-bit index of the public ID. | 4 |
| t=0 0 | t=<start time><stop time> | Yes | No | Yes | Added by EA. | 0 |
| m=audio 3456 RTP/AVP 97 96 | m=audio | Yes | No | N/A | N/A | 24 |
| | Five digit port number (e.g. 3456) | No | No | N/A | N/A | 40 |
| | RTP/AVP | Yes | No | N/A | N/A | 24 |
| | Five character codec codes (e.g., 97 96) | No | No | N/A | N/A | 40 |
| b=AS:25.4 | b=<modifier>:<bandwidth-value> | Partial | No | Yes | Added by EA based on 'm=audio" type. | 0 |
| a=curr:qos local none | a=<attribute>:<value> | Partial | No | Yes | Based on 'precondition' included in the 'Require' field. | 0 |
| a=curr:qos remote none | a=<attribute>:<value> | Partial | No | Yes | Based on 'precondition' included in the 'Require' field. | 0 |
| a=des:qos mandatory local sendrecv | a=<attribute>:<value> | Partial | Yes | N/A | N/A | 24 |
| a=des:qos none remote sendrecv | a=<attribute>:<value> | Partial | Yes | N/A | N/A | 24 |
| a=rtpmap:97 AMR | a=rtpmap: | Yes | No | N/A | N/A | 24 |
| | Six character codec information (e.g., 97 AMR) | Partial | No | N/A | N/A | 48 |
| a=fmtp:97 mode-set=0, 2, 5, 7; maxframes=2 | a=fmtp <format><format specific parameters> | Partial | No | Yes | Configured at the P-CSCF per codec type (such as AMR, EVRC etc.). Added by EA | 0 |
| a=rtpmap:96 telephone-event | a=rtpmap:<payload type><encoding name>/<clock rate>(/<encoding parameters>) | Partial | No | Yes | Configured at the P-CSCF per codec type (such as AMR, EVRC etc.). Added by EA | 0 |
| Total Bits | 1341 | | | | | |
| Total Bytes | 167.625 | | | | | |

TABLE 2

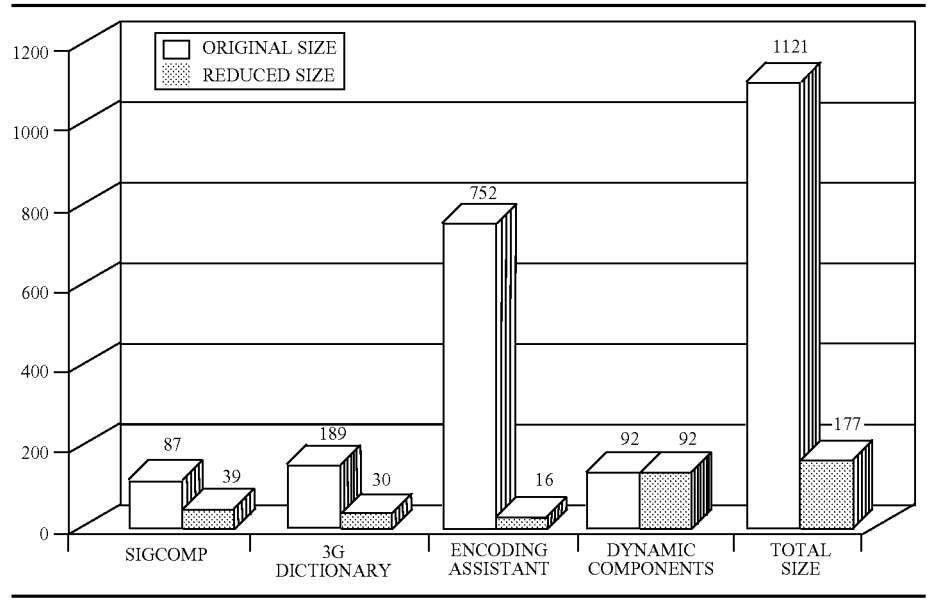

The invention claimed is:

1. A packet-based communication system comprising:

a first network element that receives a first compressed request message from an originating communication device to initiate a communication session between the originating communication device and a terminating communication device, said first compressed request message including parameter entries from a defined first parameter dictionary and a defined second parameter dictionary, said first and second dictionaries containing compressed parameter data elements substituted for non-compressed data elements; and said first network element decompresses the first compressed request message to generate a first decompressed request message for transmission to a communication server, said generation of said first decompressed message occurs after the network element decodes a first parameter using the defined first parameter dictionary, a second parameter using the second defined parameter dictionary having a preferred identity parameter and an access network parameter, and a third parameter using an encoding assistant function, and said first network element transmits said first decompressed request message to a proxy server that was used to register said originating communication device on said first network.

2. The packet-based communication system of claim 1, further comprising:

said originating communication device executes an encoding assistant function to generate said first compressed request message.

3. The packet-based communication system of claim 2, further comprising:

said originating device generates the first compressed request message based on the use of a compression algorithm in conjunction with the defined first parameter dictionary and the defined second parameter dictionary.

4. The packet-based communication system of claim 1, further comprising:

said first network element receives a first response message from a proxy server used to initiate the communication session between the originating communication device and a terminating communication device, said first response message compressed by the first network element using the defined first parameter dictionary and the defined second parameter dictionary to generate a first compressed response message, and said first compressed response message being transmitted from the first network element to the originating communication device.

5. The packet-based communication system of claim 4, further comprising:

said first network element executes an encoding assistant function to generate said first compressed response message.

6. The packet-based communication system of claim 4, further comprising:

said first network element utilizes a compression algorithm in conjunction with the defined first parameter dictionary and the defined second parameter dictionary to generate the first compressed response message.

7. The packet-based communication system of claim 4, further comprising:

said first network element compresses the first response message to generate the first compressed response message for transmission to a communication device by encoding a first parameter using the defined first parameter dictionary, encoding a second parameter using the second defined parameter dictionary, and encoding a third parameter using an encoding assistant function.

8. The packet-based communication system of claim 1, wherein the first compressed request message has a compressed session initiation protocol request message.

9. The packet-based communication system of claim 4, wherein the first compressed response message has a compressed session initiation protocol response message.

10. A method for communicating in a multimedia communication protocol on a packet-based communication system, comprising the steps of:

establishing context between a first network element and a mobile node during the session initiation protocol registration process to enable use of the header reduction protocol for the subsequent session initiation protocol messages;

receiving at the first network element a first reduced request message for initiating a multimedia communication session, said first reduced request message having a reduced header field length compared to a non-reduced request message;

expanding the first reduced request message to form a first expanded request message, said expanding performed utilizing an algorithm in conjunction with a defined first parameter dictionary and defined second parameter dictionary having a preferred identity parameter and an access network parameter, and an encoding assistant;

receiving dynamic parameters in said request message that are not reduced; and transmitting said first expanded request message to a second network element.

11. The method for communicating in a multimedia communication protocol on a packet-based communication system of claim 10, further comprising the step of:

retrieving a reduced data element associated with a contact list containing collective contact data used to setup communication with other users from a third network element based on a non-reduced parameter used by the encoding assistant.

12. The method for communicating in a multimedia communication protocol on a packet-based communication system of claim 10, further comprising the step of:

receiving a first response message at the first network element;

preparing a first reduced response message by using an algorithm in conjunction with a defined first parameter dictionary to reduce a first group of applicable header parameters to a reduced length;

preparing the first reduced response message by using an algorithm in conjunction with a defined second parameter dictionary to reduce a second group of applicable header parameters to a reduced length; and preparing the first reduced response message using an encoding assistant function to reduce a third group of applicable header parameters to a reduced length; and transmitting the first reduced response message to a coupled first communication device over a wireless communication link.

13. The method for communicating in a multimedia communication protocol on a packet-based communication system of claim 12, further comprising the steps of:

receiving the first un-reduced request message at the second network element for processing; and transmitting the first response message from the second network element.

14. The method for communicating in a multimedia communication protocol on a packet-based communication system of claim 10, further comprising the step of:

coupling a communication device to the first network element using a wireless communication link;

preparing a first reduced request message by using an algorithm in conjunction with a defined first parameter dictionary to reduce a first group of applicable header parameters to a first reduced length;

preparing the first reduced request message by using an algorithm in conjunction with a defined second parameter dictionary to reduce a second group of applicable header parameters to a second reduced length;

preparing the first reduced request message using an encoding assistant function to compress a third group of applicable header parameters to a third reduced length; and transmitting the first reduced request message to the coupled first network element over the wireless communication link.

15. The method for communicating in a multimedia communication protocol on a packet-based communication system of claim 10, wherein the first reduced request message comprises a reduced session initiation protocol request message.

16. A method for communicating on a packet-based communication system, comprising the steps of:

receiving at a first network element a request message establishing context for a message compression protocol to operate on the system;

receiving at the first network element a first response message for initiating a multimedia communication session, said first response message having a non-compressed header field length;

compressing the headers in the first response message to form a first compressed response message, said compression performed utilizing an algorithm in conjunction with a defined first parameter dictionary and defined second parameter dictionary having a preferred identity parameter and an access network parameter, and an encoding assistant;

receiving dynamic parameters in said response message that are not compressed; and transmitting said first compressed response message to a communication device over a wireless communication link.

17. The method for communicating on a packet-based communication system of claim 16, further comprising the step of:

preparing the first response message by compressing a first group of header parameters using the defined first parameter dictionary to reduce that grouping of parameter header to a compressed length, compressing a second group of header parameters using the defined second parameter dictionary to reduce that group of header size to a compressed length, and compressing a third group of header parameters using the encoding assistant to reduce that group of header size to a compressed length, said compressed length achieved being no more than 25% of the non-compressed length.

18. The method for communicating on a packet-based communication system of claim 16, further comprising the steps of:

receiving at the first network element a first compressed request message for initiating a multimedia communication session;

decompressing the first compressed request message to form a first decompressed request message, said decompression performed utilizing an algorithm in conjunction with a defined first parameter dictionary and defined second parameter dictionary, and an encoding assistant; and transmitting said first decompressed request message to a second network element.

19. The method for communicating on a packet-based communication system of claim 18, wherein the first compressed request message has a compressed session initiation protocol request message.

20. The method for communicating on a packet-based communication system of claim 16, wherein the first compressed response message has a compressed session initiation protocol response message.

21. A system operating to reduce the size of packets used to initiate multimedia communication, comprising:

a computer server on a first network operating a header size reduction protocol to compress and decompress packet header sizes, said protocol performing a first operation using a first defined dictionary, a second operation using a second defined dictionary having a preferred identity parameter and an access network parameter, and a third operation using an encoding assistant, each of said operations processing a message used to initiate multimedia communication, with a compression performed on packets routed to a wireless connection and a decompression performed on packets routed over a wire connection; and a second network server on a second network receiving said decompressed packet for processing and use to initiate a multimedia communication session over said wire connection, and said second computer server transmitting compressed packets for wireless transmission to user equipment also operating an encoding assistant to initiate multimedia communication.

22. The system operating to reduce the size of packets used to initiate multimedia communication of claim 21, wherein the preferred identity parameter and an access network parameter in the second defined dictionary includes at least one of the following parameters:
  a. P-Preferred-Identity; and
  b. P-Access-Network-Info.

23. The system operating to reduce the size of packets used to initiate multimedia communication of claim 21, wherein the second defined dictionary includes at least one of the following parameters:
  a. Max-Forwards: 70;
  b. Require: sec-agree, precondition;
  c. Supported: 100 rel;
  d. Spi:s;
  e. Port:c=; and
  f. Port:s=.

24. The system operating to reduce the size of packets used to initiate multimedia communication of claim 21, wherein the second defined dictionary includes at least one of the following Session Description Protocol parameters:
  a. Content-Type: application/SDP;
  b. a=des:qos mandatory, local sendrecv;
  c. a=des:qos none, local sendrecv; and
  d. a=inactive.

25. The system operating to reduce the size of packets used to initiate multimedia communication of claim 21, wherein the encoding assistants on the system operate to perform one or more of the following to compress a packet header:
  a. encode an identifier associated with a contact list entry;
  b. delete a protocol description component;
  c. encode an identity data element based on an exchanged index value; and
  d. delete a parameter component.

26. The system operating to reduce the size of packets used to initiate multimedia communication of claim 21, wherein the encoding assistants on the system operate to perform one or more of the following to decompress a packet header:
  a. decode an identifier associated with a contact list entry;
  b. create a protocol description component;
  c. decode an identity data element based on an exchanged index value; and
  d. create a parameter component.

27. The system operating to reduce the size of packets used to initiate multimedia communication of claim 22, wherein the encoding assistants on the system operate to perform one or more of the following:
  a. encode a P-Preferred-Identity header using an established index value to compress a packet header;
  b. encode an access network type in the P-Access-Network-Info header to compress a packet header;
  c. decode a P-Preferred-Identity header using an established index value to decompress a packet header; and
  c. decode an access network type in a P-Access-Network-Info header to decompress a packet header.

28. The system operating to reduce the size of packets used to initiate multimedia communication of claim 21, wherein the encoding assistants on the system operate to compress a packet by performing one or more of the following:
  a. delete an o=line parameter to compress the packet header;
  b. delete a s=line parameter to compress the packet header;
  c. delete a c=line parameter to compress the packet header; and
  d. delete a t=line parameter to compress the packet header.

29. The system operating to reduce the size of packets used to initiate multimedia communication of claim 27, wherein the encoding assistants on the system operate to decompress a packet by performing one or more of the following:
  a. create an o=line parameter to decompress the packet header;
  b. create a s=line parameter to decompress the packet header;
  c. create a c=line parameter to decompress the packet header; and
  d. create a t=line parameter to decompress the packet header.

30. The system operating to reduce the size of packets used to initiate multimedia communication of claim 21, wherein the encoding assistants on the system operate to compress a packet by performing one or more of the following:
  a. delete a b=line parameter to compress the packet header;
  b. delete an a=curr: local none line parameter to compress the packet header;
  c. delete an a=curr: remote none line parameter to compress the packet header;
  d. delete an a=fmtp line parameter to compress the packet header; and
  e. delete an a=rtpmap: nn telephone event line to compress the packet header.

31. The system operating to reduce the size of packets used to initiate multimedia communication of claim 30, wherein the encoding assistants on the system operate to decompress a packet by performing one or more of the following:
  a. create a b=line parameter to decompress the packet header;
  b. create an a=curr: local none line parameter to decompress the packet header;
  c. create an a=curr: remote none line parameter to decompress the packet header;
  d. create an a=fmtp:nn line parameter to decompress the packet header; and
  e. create an a=rtpmap: nn telephone event line to decompress the packet header.

32. The system operating to reduce the size of packets used to initiate multimedia communication of claim 21, wherein the encoding assistants on the system operate to decompress a packet by performing one or more of the following:
　a. add a Route header field to decompress a packet;
　b. add an Allow header field to decompress a packet;
　c. add a Privacy header field to decompress a packet;
　d. add at least one element to the From header field to decompress a packet header; and
　e. modify elements in a Security-Verify header to decompress a packet header.

33. The system operating to reduce the size of packets used to initiate multimedia communication of claim 21, wherein the encoding assistants on the system operate to compress a packet by performing one or more of the following:
　a. delete a To header to compress a packet;
　b. delete at least one element from a From header to compress a packet header;
　c. modify elements in a Security-Verify header to compress a packet header;
　d. delete a Privacy header to compress a packet; and
　e. delete an Allow header to compress a packet.

* * * * *